United States Patent
Lin et al.

(10) Patent No.: US 7,396,418 B2
(45) Date of Patent: Jul. 8, 2008

(54) PROCESS FOR REMOVING PARTICLES FROM RETICLE

(75) Inventors: Po-Ching Lin, Hsinchu (TW); Yu-Cheng Yang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 8 days.

(21) Appl. No.: 11/747,231

(22) Filed: May 11, 2007

(65) Prior Publication Data

US 2007/0204882 A1 Sep. 6, 2007

Related U.S. Application Data

(62) Division of application No. 10/709,335, filed on Apr. 29, 2004, now Pat. No. 7,234,196.

(51) Int. Cl.
*B08B 7/04* (2006.01)

(52) U.S. Cl. .............................. 134/18; 134/34; 134/36; 134/37

(58) Field of Classification Search .................... 134/18, 134/36, 37, 34; 15/301, 303, 306.1, 316.1
See application file for complete search history.

(56) References Cited

U.S. PATENT DOCUMENTS 7,047,984 B2 * 5/2006 Blattner et al. ............... 134/1.3

FOREIGN PATENT DOCUMENTS

JP 06-163344 * 6/1994

* cited by examiner

*Primary Examiner*—Zeinab El-Arini
(74) *Attorney, Agent, or Firm*—Jianq Chyun IP Office

(57) ABSTRACT

A process for removing particles from a reticle is described, wherein the process is performed by using a pellicle particle detector (PPD) and a particle removing tool disposed in front of the PPD as well as fixed to the PPD. The particle removing tool includes at least one gas spray member directed toward a surface of the reticle for removing particles. The process includes steps as follows, step (a) loading the reticle into the PPD through the gas spray member to detect whether the reticle has particles thereon; step (b) ejecting the reticle from the PPD; step (c) turning on the particle removing tool as well as going back to step (a) when particles are detected on the reticle, and ending the particle removal process when no particle is detected on the reticle.

4 Claims, 3 Drawing Sheets

PROCESS FOR REMOVING PARTICLES FROM RETICLE

CROSS-REFERENCE TO RELATED APPLICATION

This application is a divisional of a prior application Ser. No. 10/709,335, filed Apr. 29, 2004, now U.S. Pat. No. 7,234,196 now allowed. The entirety of each of the above-mentioned patent application is hereby incorporated by reference herein and made a part of this specification.

BACKGROUND OF THE INVENTION

1. Field of the Invention

This invention generally relates to equipment for lithography processes, and more particularly to a tool and a process for removing particles from a reticle.

2. Description of Related Art

In a lithography process, one of the key factors affecting the pattern quality is the quality of the reticle. To improve the quality of the reticle, some may improve the manufacturing process of the reticle, protect the pattern on the reticle from damage, or prevent particles from adhering to the reticle.

To protect the pattern on the reticle from damage, a pellicle is usually disposed on the reticle. Moreover, to prevent the exposure process from being affected by particles, when the reticle is entered into the loader of the mask aligner, a pellicle particle detector (PPD) is used to detect particles. If particles are detected on the reticle, the operator will unload the reticle and use a gas spray gun to remove the particles from the reticle. Then, the operator will reload the reticle into the PPD to check whether there are particles remaining on the reticle or not. This procedure would take a long time and increase the burden of the operator. Furthermore, the reticle may be damaged due to the operator's negligence.

SUMMARY OF THE INVENTION

Accordingly, the present invention is related to a tool for removing particles from a reticle in order to save the particle removal time, reduce the operator's burden, and reduce the possibility of reticle damage due to the operator's negligence.

Another object of the present invention is to provide a process of removing particles from a reticle that utilizes the tool for removing particles from a reticle of the present invention.

The tool for removing particles from a reticle of the present invention is disposed in front of a pellicle particle detector, including at least a gas spray member directed toward a surface of the reticle for removing particles and a supporting member supporting the gas spray member disposed in front of the pellicle particle detector. The supporting member can further fix the tool onto the pellicle particle detector.

According to an embodiment of the present invention, a pellicle particle detector and the aforementioned particle removing tool disposed in front of the pellicle particle detector are used for removing particles from the reticle. In the present embodiment, the process of removing particles from the reticle includes the following steps: (a) loading the reticle into the pellicle particle detector through the gas spray member to detect whether the reticle has particles thereon, (b) ejecting the reticle from the pellicle particle detector, and (c) turning on the particle removing tool when particles are detected on the reticle, and going back to step (a); and ending the particle removal process when no particle is detected on the reticle.

As described above, the process of removing particles from a reticle of the present invention utilizes the particle removing tool of the present invention that is disposed ahead of the PPD. Hence, when the reticle is reentered into the PPD, the particles thereon can be removed at the same time. Therefore, by using the tool and the process of removing particles from a reticle of the present invention, the operator need not unload the reticle and remove the particles manually, thereby saving the particle removal time, reducing the operator's burden, and reducing the possibility of reticle damage due to the operator's negligence.

The above is a brief description of some deficiencies in the prior art and the advantages of the present invention. Other features, advantages and embodiments of the invention will be apparent to those skilled in the art from the following descriptions, accompanying drawings and claims.

DESCRIPTION OF THE PREFERRED EMBODIMENTS

Figure 1:
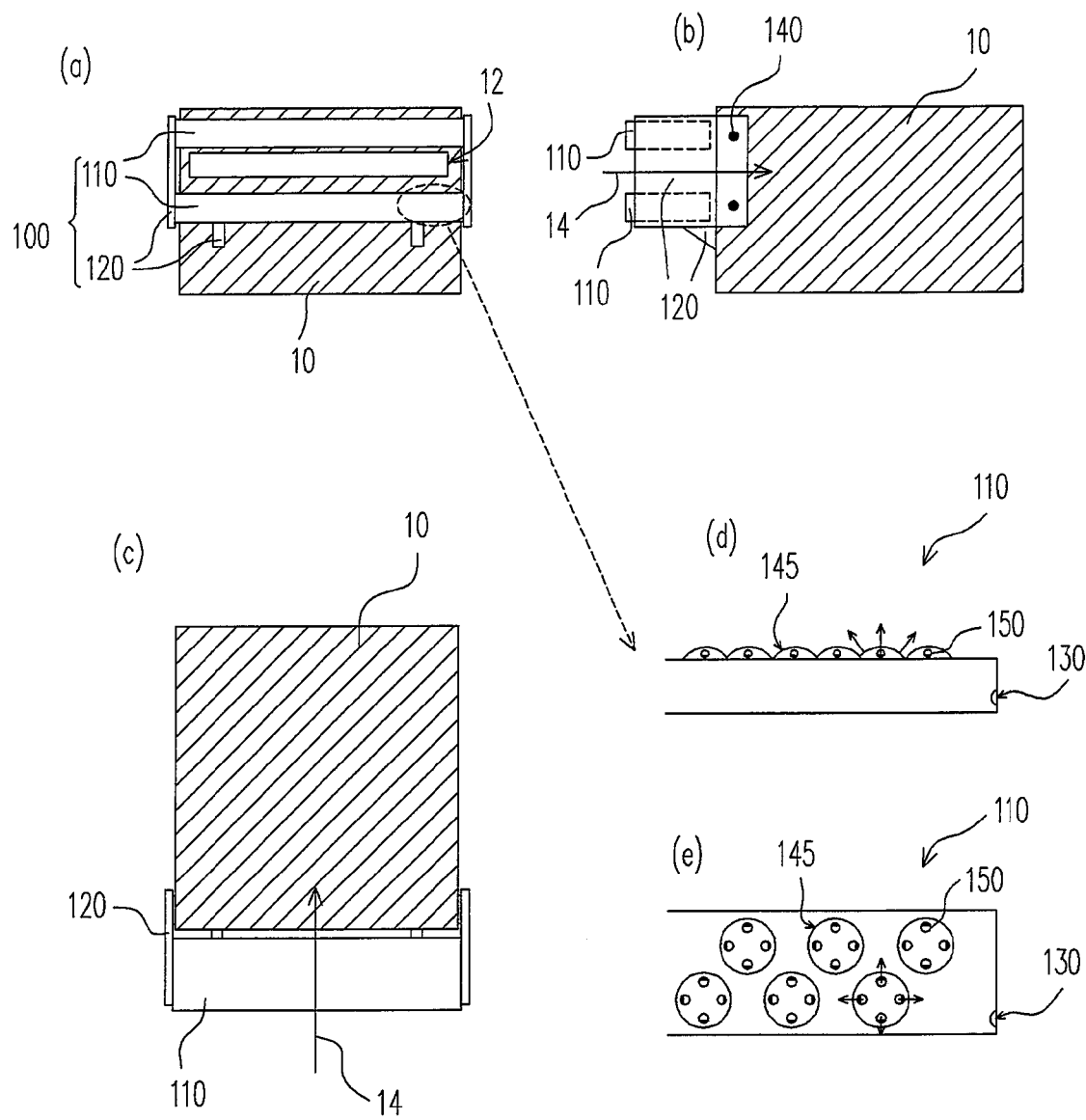
FIGS. 1(a)-(c) respectively show the front view, side view, and top view of a tool for removing particles from a reticle in accordance with a preferred embodiment of the present invention, which is fixed onto a PPD.
FIG. 1(d) shows a partially magnified view of the gas spray member shown in FIG. 1(a).
FIG. 1(e) shows the top view of the gas spray member of FIG. 1(d).

FIGS. 1(a)-(c) respectively show the front view, side view, and top view of the tool for removing particles from a reticle in accordance with an embodiment of the present invention, which is fixed onto a PPD. As shown in FIGS. 1(a)-(c), the particle removing tool 100 is disposed in front of the PPD 10 and includes two gas spray members 110 and a supporting member 120. There is a space between the two gas spray members 110 for a reticle to pass through, and the space is right directed to the reticle entrance 12 of the PPD 10. The moving direction of the reticle is indicated by the arrow 14. Each of the two ends of the gas spray members 110 is fixed onto a plate-like part of the supporting member 120. The particle removing tool 100 can be fixed onto the PPD 10 via the supporting member 120 that can be fixed using screws 140. Furthermore, the lower gas spray member 110 can be further supported on the PPD 10 by some small parts of the small supporting member 120.

FIG. 1(d) shows a partially magnified view of the gas spray member shown in FIG. 1(a). FIG. 1(e) shows the top view of the gas spray member of FIG. 1(d). Referring to FIGS. 1(d) and 1(e), the gas spray member 110 has a plurality of multi-directional gas spray heads 145 thereon. Each of the gas spray heads 145 has, for example, four gas spray holes 150 with four different orientations to enhance the particle removal performance. The top of the gas spray heads can have a domed shape. The gas spray member 110 also has a gas supply inlet 130 that connects with all gas spray holes 150.

Figure 2:
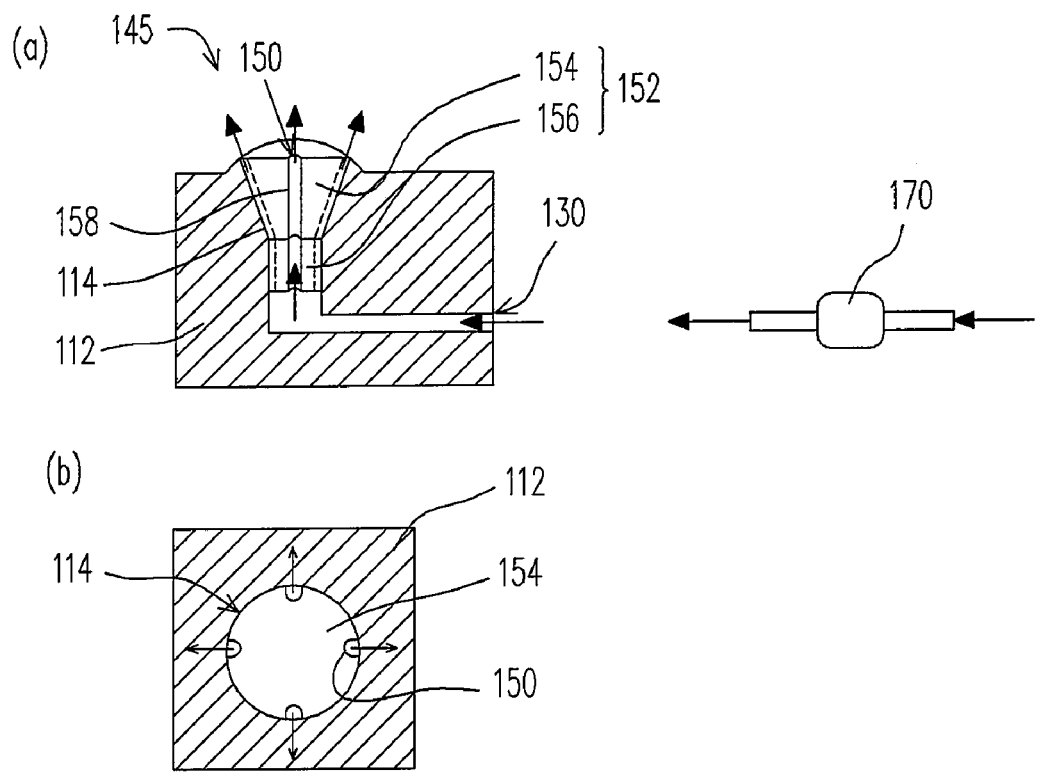
FIGS. 2(a) and 2(b) respectively show the side view and top view of a multi-directional gas spray head on the gas spray member in accordance with an embodiment of the present invention.

FIGS. 2(a) and 2(b) respectively show the side view and top view of a multi-directional gas spray head 145 on the gas spray member 110 in accordance with an embodiment of the present invention. As shown in FIGS. 2(a) and 2(b), the multi-directional gas spray head 145 includes a main body 112 and a plug 152. The main body 112 includes a gas supply inlet 130 and many holes 114 connecting with the gas supply inlet 130. Each of the holes 114 corresponds to one multi-directional gas spray head 145, and the top portion of each hole 114 has a slant sidewall. Each plug 152 is embedded in a hole 114 and includes a reverse conoid top 154 and a columnar bottom 156 matching the hole 114. There are several longitudinal grooves 158, for example, four grooves 158, formed around the plug 152, serving as gas supply channels between the main body 112 and the plug 152 for connecting the gas supply inlet 130 and the gas spray holes 150. Furthermore, a particle filter 170 can be disposed between the gas supply inlet 130 and the gas source (not shown) to filter out the particles in the supplied gas.

By using the above design, one can easily make a multi-directional gas spray head with a certain number of gas spray holes with different orientations. Furthermore, if it's required to avoid generation of turbulence on the surface of the reticle due to the gas spray, each gas supply channel can be installed with a micro-control valve so that the multi-directional gas spray head can spray gas in a single direction.

Figure 3:
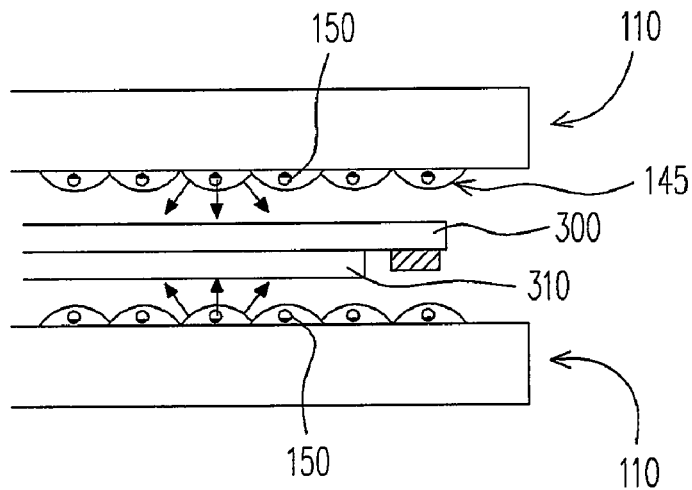
FIG. 3 shows an operation of the two gas spray members of the tool for removing particles from a reticle.

FIG. 3 shows the operation of the two gas spray members of the tool for removing particles from a reticle. As shown in FIG. 3, when the reticle 300 is being cleaned by the particle removing tool 100, the pellicle 310 on the reticle 300 faces down, which means that the reticle is loaded into the PPD 10 with the pellicle 310 facing down, as indicated by FIG. 1(a) and FIG. 3. Because the particle removing tool 100 includes an upper and a lower gas spray members 110, it can remove particles from the glass portion of the reticle 300 and the surface of the pellicle 310 at the same time.

Figure 4:
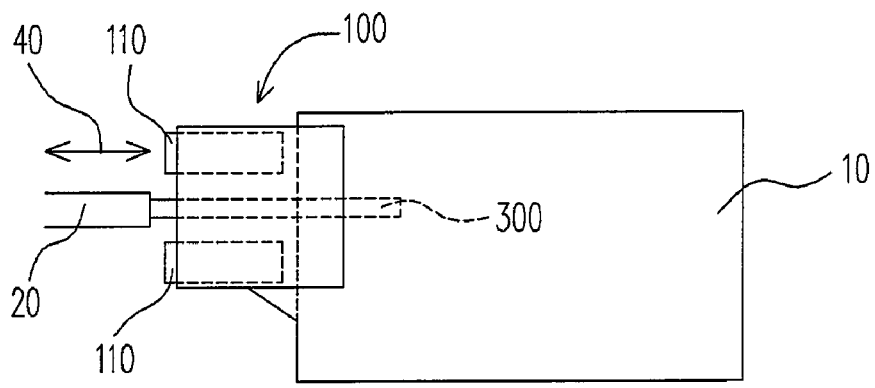
FIG. 4 shows a moving direction of the reticle during the particle removing process in accordance with an embodiment of the present invention.
Figure 5:
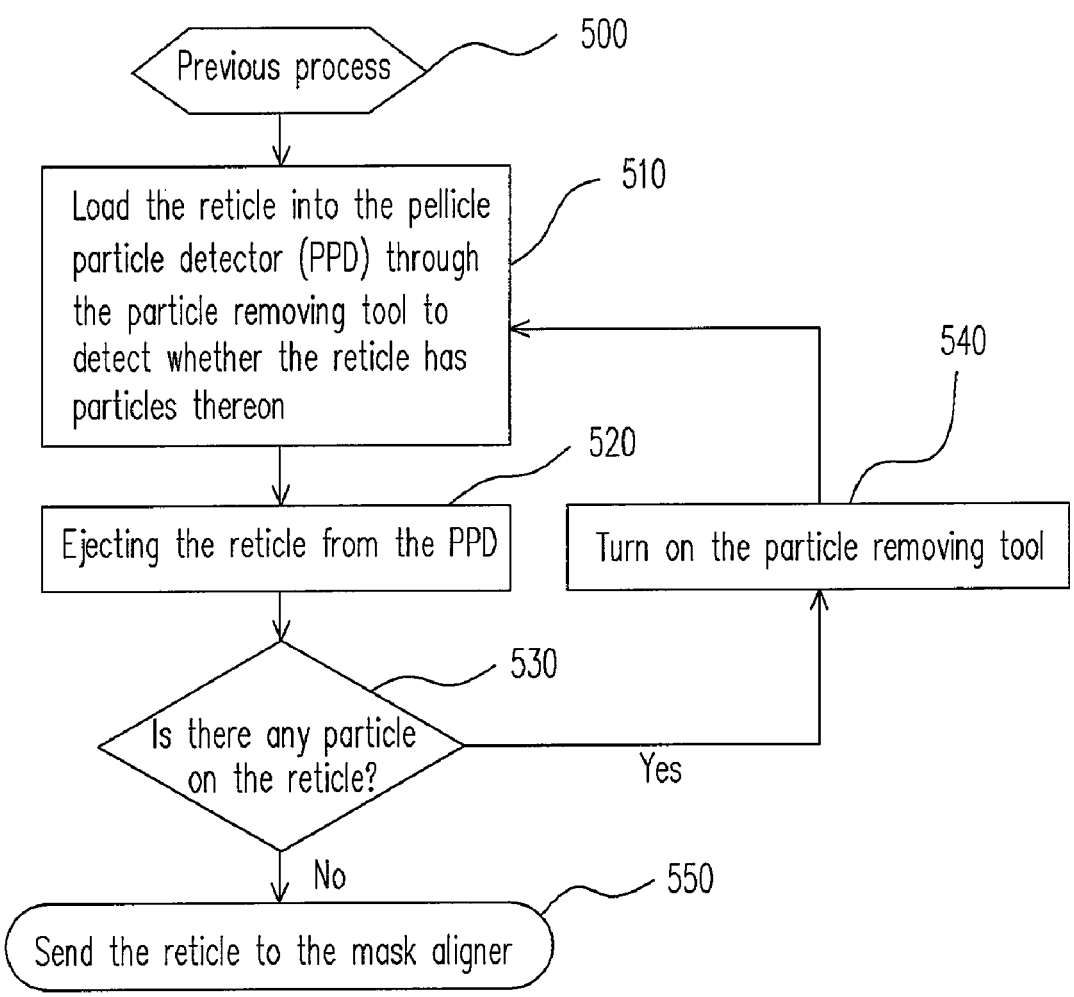
FIG. 5 shows the flow chart of the process for removing particles from a reticle in accordance with an embodiment of the present invention.

FIG. 4 shows the moving direction of the reticle during the process of removing particles from a reticle in accordance with an embodiment of the present invention. FIG. 5 shows the flow chart of the process for removing particles from a reticle in accordance with an embodiment of the present invention. Referring to FIGS. 4 and 5, the reticle 300 is carried by a robot arm 20. As shown in FIG. 4, the robot arm 20 moves the reticle 300 along the direction of arrow 40 to load the reticle 300 into or unload it from the PPD 10.

As shown in FIG. 5, after the above steps, the reticle is loaded into the PPD through between two gas spray members to detect whether the reticle has particles thereon (step 510). Then, the reticle is ejected from the PPD (step 520) and stopped on the robot arm 20 waiting for further operation. The process then proceeds to a decision making step 530. When the PPD detects particles on the reticle, the particle removing tool will be turned on (step 540) and the process goes back to step 510. In the meantime, the two gas spray members of the particle removing tool can remove the particles from the reticle that is moved through between the two gas spray members. When the PPD detects no particle on the reticle, it means the particle removing process is complete and the reticle can be sent to the mask aligner (step 550).

In light of the above, the process of removing particles from a reticle of the present invention utilizes the particle removing tool of the present invention disposed ahead of a PPD. Hence, when the reticle is reentered into the PPD, the particles can be removed at the same time. Therefore, by using the tool and process for removing particles from a reticle of the present invention, the operator need not unload the reticle and remove the particles manually, thereby saving the particle removal time, reducing the operator's burden, and reducing the possibility of reticle damage due to the operator's negligence.

In addition, though the particle removing tool in the above embodiment has two gas spray members, the structure of the particle removing tool of this invention is not restricted to this. The particle removing tool may have only one or more than two gas spray members as required. For example, when the particle removing tool has only one gas spray member, the gas spray member may be shaped as a flat pipe open at two ends thereof. The flat pipe allows the reticle to pass through, and has many gas spray holes on its inner surfaces facing the upper and lower surfaces of the reticle for spraying gas onto the reticle to remove particles.

The above description provides a fall and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A process, for removing particles from a reticle using a pellicle particle detector and a particle removing tool disposed in front of the pellicle particle detector as well as fixed to the pellicle particle detector, the particle removing tool including at least one gas spray member directed toward a surface of the reticle for removing particles, the process comprising:

step (a) loading the reticle into the pellicle particle detector through the gas spray member to detect whether the reticle has particles thereon;

step (b) ejecting the reticle from the pellicle particle detector; and step (c) turning on the particle removing tool when particles are detected on the reticle, and going back to step (a); and ending the particle removal process when no particle is detected on the reticle.

2. The process of claim 1, wherein the particle removing tool includes two gas spray members allowing the reticle to pass through a space between the two gas spray members, and the reticle is loaded into the pellicle particle detector through the space between the two gas spray members.

3. The process of claim 1, wherein a pellicle on the reticle faces down when the reticle is loaded into the pellicle particle detector through the gas spray member.

4. The process of claim 1, further comprising a step of using a robot arm to move the reticle.

* * * * *